(12) United States Patent
Kusunoki et al.

(10) Patent No.: US 8,227,069 B2
(45) Date of Patent: Jul. 24, 2012

(54) PROCESS FOR PRODUCING GRAPHENE/SIC COMPOSITE MATERIAL AND GRAPHENE/SIC COMPOSITE MATERIAL OBTAINED THEREBY

(75) Inventors: Michiko Kusunoki, Nagoya (JP); Wataru Norimatsu, Nagoya (JP)

(73) Assignee: National University Corporation Nagoya University, Nagoya-Shi (JP)

( * ) Notice: Subject to any disclaimer, the term of this patent is extended or adjusted under 35 U.S.C. 154(b) by 0 days.

(21) Appl. No.: 13/032,884

(22) Filed: Feb. 23, 2011

(65) Prior Publication Data

US 2011/0143093 A1     Jun. 16, 2011

Related U.S. Application Data

(63) Continuation of application No. PCT/JP2009/004200, filed on Aug. 28, 2009.

(30) Foreign Application Priority Data

Aug. 28, 2008 (JP) ................. 2008-220179

(51) Int. Cl.
*B32B 3/00* (2006.01)
*B32B 5/00* (2006.01)
(52) U.S. Cl. ................ 428/141; 428/332; 977/734
(58) Field of Classification Search ............ 428/141; 438/758, 761, 762, 765, 769, 931
See application file for complete search history.

(56) References Cited

FOREIGN PATENT DOCUMENTS

| JP | 2008-050228 A1 | 3/2008 |
| JP | 2008-120660 A1 | 5/2008 |

OTHER PUBLICATIONS

P. Lauffer et al., "Atomic and electronic structure of few-layer graphene on SiC(0001) studied with scanning and tunneling microscopy and spectroscopy," Phsyical Review B 77, Apr. 18, 2008, pp. 155426-1-155426-10.*
A. Mattausch et al., "Ab Initio Study of Graphene on SiC," Physcial Review Letter, vol. 99, Aug. 15, 2007, pp. 076802-1-076802-4.*
J. Penuelas et al., "Surface morphology and characterization of thin graphene films on SiC vicinal substrate," Physical Review B 79, Jan. 21, 2009, pp. 033408-1-033408-4.*
K.S. Novoselov et al., "*Electric Field Effect in Atomically Thin Carbon Films*," Science, vol. 306, No. 5696, Oct. 22, 2004, pp. 666-669.
S.V. Morozov et al., "*Giant Intrinsic Carrier Mobilities in Graphene and Its Bilayer*," Physical Review Letters, vol. 100, Issue 1, Jan. 11, 2008, pp. 016602-1-016602-4.
S.Y. Zhou et al., "*Substrate-Induced Bandgap Opening in Epitaxial Graphene*," Nature Materials, vol. 6, Oct. 2007, pp. 770-775. A. Charrier et al., "*Solid-State Decomposition of Silicon Carbide for Growing Ultra-Thin Heteroepitaxial Graphite Films*," Journal of Applied Physics, vol. 92, No. 5, Sep. 1, 2002, pp. 2479-2484.
J. Hass et al., "*Highly Ordered Graphene for Two Dimensional Electronics*," Applied Physics Letters, vol. 89, 2006, pp. 143106-1-143106-3.
C. Virojanadara et al., "*Substrate Orientation: A Way Towards Higher Quality Monolayer Graphene Growth on 6H-SiC(0001)*," Surface Science, vol. 603, 2009, pp. L-87-L-90.

* cited by examiner

*Primary Examiner* — David R Sample
*Assistant Examiner* — Laura Auer
(74) *Attorney, Agent, or Firm* — Burr & Brown

(57) ABSTRACT

A graphene/SiC composite material is provided in which a large-area graphene layer that is flat at an atomic level is formed on an SiC single crystal substrate. The process for producing the graphene/SiC composite material includes the steps of removing an oxide film that is formed by natural oxidation and covers a surface of the SiC single crystal substrate, thereby exposing an Si surface of the SiC single crystal substrate, heating the SiC single crystal substrate with the Si surface exposed under an oxygen atmosphere, thereby forming an $SiO_2$ layer on the surface of the SiC single crystal substrate, and heating the SiC single crystal substrate under vacuum on which the $SiO_2$ layer was formed.

3 Claims, 4 Drawing Sheets

PROCESS FOR PRODUCING GRAPHENE/SIC COMPOSITE MATERIAL AND GRAPHENE/SIC COMPOSITE MATERIAL OBTAINED THEREBY

This application is a continuation of the International Application No. PCT/JP2009/004200 filed Aug. 28, 2009, which claims the benefit under 35 U.S.C. §119(a)-(d) of Japanese Patent Application 2008-220179, filed Aug. 28, 2008, the entireties of which are incorporated herein by reference.

FIELD OF THE INVENTION

The present invention relates to a process for producing a graphene/SiC composite material and a graphene/SiC composite material obtained thereby.

BACKGROUND OF THE INVENTION

A graphene layer (a graphite sheet) is a monolayer of carbon atoms and a structure thereof shows a six-membered ring of carbon atoms that are densely packed. It has been known that electrons behave as relativistic particles having a mass of zero in the inside of the graphene layer to show a remarkably high electron mobility. Further, of the known substances, the graphene layer has the highest melting point and is also excellent in thermal conductivity. Accordingly, since the first report (see non-patent document 1), the graphene layer has become an active area of research among researchers. Under such situations, recently, various reports have been made on the graphene layer.

For example, non-patent document 2 reports that an electron mobility exceeding 200,000 $cm^2/Vsec$ has been measured in graphene. Such a high electron mobility corresponds to about 100 times the electron mobility of Si (silicon) and 5 times or more the electron mobility of carbon nanotubes. Further, non-patent document 3 reports that there is a bandgap of 0.26 eV between two-layer graphene and a SiC substrate, and proposes applications of graphene to transistors and other electronics.

As techniques for forming a graphene layer having the above-described excellent characteristics, for example, on a substrate, there have hitherto been widely known 1) a technique of transferring one or more graphene layers, which are exfoliated from graphite crystals showing a stacking structure (see patent document 1), onto a $SiO_2/Si$ substrate, 2) a technique of heating a SiC substrate under (ultra) high vacuum to sublime Si atoms and forming a graphene layer on the SiC substrate by self-organization of remaining C (carbon) atoms, and the like.

However, the technique of the above 1) has an inherent problem that when the graphene layer is exfoliated from the graphite crystals, it largely depends on chance, so that it is difficult to obtain a large-area graphene layer. Further, the graphene layer to be obtained according to the technique of the above 2) has relatively many irregularities in an atomic level, and the maximum length of the graphene layer is about 200 nm, which is not sufficiently large.

Accordingly, particularly in the semiconductor industry, development of a graphene/SiC composite material has been earnestly desired at present in which a large-area graphene layer that is flat in an atomic level is formed on a SiC substrate.

PRIOR-ART DOCUMENTS

Patent Document

Patent Document 1: JP-A-2008-120660

Non-Patent Documents

Non-Patent Document 1: K. S. Novoselov and seven others, "Electric Field Effect in Atomically Thin Carbon Films", Science (USA), Vol. 306, No. 5696, pp. 666-669, Oct. 22, 2004

Non-Patent Document 2: S. V. Morozov and six others, "Giant Intrinsic Carrier Mobilities in Graphene and Its Bilayer", Physical Review Letters (USA), Vol. 100, No. 1, 016602 (article number), Jan. 11, 2008

Non-Patent Document 3: S. Y. Zhou and eight others, "Substrate-induced bandgap opening in epitaxial graphene", Nature Materials (UK), Vol. 6, pp. 770-775, September 2007

SUMMARY OF THE INVENTION

The present invention has been made in the light of the situations described above. It is therefore an object of the present invention to provide a process for advantageously producing a graphene/SiC composite material in which at least one large-area graphene layer that is flat in an atomic level is formed on a SiC single crystal substrate. It is another object of the present invention is to provide a graphene/SiC composite material produced according to the process above.

Thus, the object of the present invention is to provide a process for producing a graphene/SiC composite material in which at least one graphene layer is formed on a SiC single crystal substrate, comprising the steps of: 1) removing an oxide film that is formed by natural oxidation and covers a surface of the SiC single crystal substrate, thereby exposing a Si surface of the SiC single crystal substrate, 2) heating the SiC single crystal substrate with the Si surface exposed under an oxygen atmosphere, thereby forming a $SiO_2$ layer on the surface of the SiC single crystal substrate, and 3) heating the SiC single crystal substrate under vacuum on which the $SiO_2$ layer was formed.

Preferably, in the process for producing a graphene/SiC composite material according the present invention, the thickness of the $SiO_2$ layer is 200 nm or less.

The another object of the present invention is to provide a graphene/SiC composite material produced according to the above process, in which at least one graphene layer is formed on a SiC single crystal substrate, wherein the graphene layer has a region that is flat in an atomic level and that has a diameter of at least 1 µm or more.

According to a preferable aspect of the graphene/SiC composite material of the present invention, the graphene layer has a region of 20 µm square or more which is free from steps of 1.5 nm or more.

According to another preferable aspect of the graphene/SiC composite material of the present invention, an outermost surface of the SiC single crystal substrate is a Si surface, a distance between the Si surface and the graphene layer nearest thereto is 0.29±0.03 nm, and a part of Si atoms constituting the Si surface and a part of C atoms constituting the nearest graphene layer form covalent bonds.

According to a favorable aspect of the graphene/SiC composite material of the present invention, the crystal structure of the SiC single crystal substrate is one of 4H—SiC and 6H—SiC.

According to another favorable aspect of the graphene/SiC composite material of the present invention, the at least one graphene layer comprises three or more graphene layers, and the three or more graphene layers show an ABC stacking structure.

As described above, in the process for producing a graphene/SiC composite material of the present invention, the removing treatment of the oxide film formed by natural oxidation on the SiC single crystal substrate is first performed on the SiC single crystal substrate whose surface is the Si surface (silicon surface) to expose the Si surface of the SiC single crystal substrate, and then, the SiC single crystal substrate with the Si surface exposed is heated under the oxygen atmosphere, thereby forming the $SiO_2$ layer on the Si surface. The $SiO_2$ layer artificially formed on the Si surface of the SiC single crystal substrate has a dense and homogeneous amorphous structure, unlike the oxide film by natural oxidation. Accordingly, when the SiC single crystal substrate having such a $SiO_2$ layer is heated under vacuum, decomposition (sublimation) of the $SiO_2$ layer uniformly proceeds. Then, when heating is further continued, after this $SiO_2$ layer has disappeared, sublimation of Si atoms and self-organization of remaining C atoms proceed effectively from the Si surface to the inside of the SiC single crystal substrate and uniformly over the whole surface of the Si surface. Thus, the graphene/SiC composite material is advantageously produced in which a large-area graphene layer that is flat in an atomic level is formed on the SiC single crystal substrate.

Incidentally, in the process for producing a graphene/SiC composite material according to the present invention, the above-described effect can be more advantageously enjoyed by making the thickness of the above-described $SiO_2$ layer to 200 nm or less.

Particularly, of the graphene/SiC composite materials produced according to the production process of the present invention, in one in which: an outermost surface of the above-mentioned SiC single crystal substrate is a Si surface; the distance between the Si surface and the graphene layer nearest thereto is 0.29±0.03 nm; and a part of Si atoms that constitute the Si surface and a part of C atoms that constitute the above-mentioned nearest graphene layer form covalent bonds, there is a bandgap. Accordingly, such graphene/SiC composite materials are expected to be used as electronic materials for semiconductors.

DETAILED DESCRIPTION OF THE INVENTION

Figure 1:
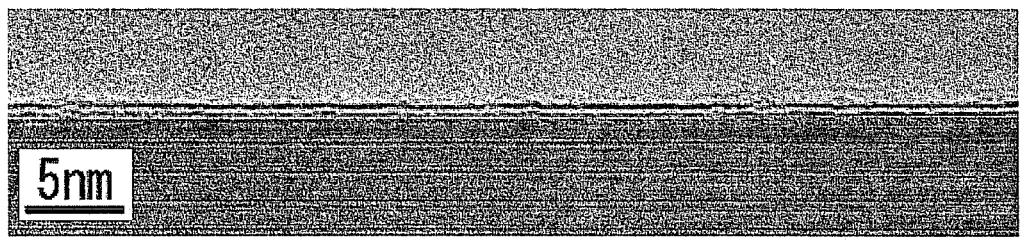
FIG. 1 is a TEM photograph of a graphene/SiC composite material produced according to the present invention.

In the production of the graphene/SiC composite material by the production process of the present invention, the SiC single crystal substrate (hereinafter also referred to as a substrate) is provided. As the SiC single crystal substrate used herein in the present invention, any one can be used as long as it is a SiC single crystal substrate that is generally commercially available as a substrate for electronic devices and a surface thereof is formed as a Si surface. The SiC single crystal substrate for electronic devices is commercially available, for example, under a name of a "SiC epitaxial wafer" or the like. Conventionally, when a graphene layer is formed on a surface of the SiC single crystal substrate, a large-area graphene layer is formed by using an off-axis substrate and utilizing steps existing on such a substrate. However, the production process of the present invention does not utilize the steps on the substrate as will be described later. Since such steps may adversely affect a structure of graphene layer to be formed, in the production process of the present invention, an on-axis SiC single crystal substrate is advantageously used.

It has been known that SiC has various kinds of crystalline polymorphs roughly classified into a cubic crystal (3C—SiC), a hexagonal crystal (2H—SiC, 4H—SiC, 6H—SiC or the like) and a rhombohedral crystal (15R—SiC or the like). In the present invention, a SiC single crystal substrate having a crystal structure of 4H—SiC or 6H—SiC is preferably used.

Generally, the commercially available SiC single crystal substrate or the like is usually covered with an oxide film (thickness: several nanometers), which is formed by natural oxidation. This oxide film is mainly composed of $SiO_2$, but also contains reaction products with moisture and the like in the air. Thus, in the process for producing a graphene/SiC composite material according to the present invention, removal of the oxide film, which is formed by natural oxidation and covering the substrate surface, is first performed on the SiC single crystal substrate. Such removal of the oxide film is a characteristic step in the production process of the present invention, together with formation of the $SiO_2$ layer on the surface of the SiC single crystal substrate, which will be described later.

As a technique for removing such an oxide film formed on the surface of the SiC single crystal substrate, any conventionally known techniques may be employed. Preferably, a technique using hydrofluoric acid is employed, in which the substrate is immersed in hydrofluoric acid, for example. Various conditions in the removal of the oxide film by using the hydrofluoric acid, such as the concentration of hydrofluoric acid and the immersion time, are appropriately decided. Further, in the present invention, it is only necessary to expose the Si surface by removing at least a part of the oxide film covering the surface of the SiC single crystal substrate, which is on the substrate surface on which a graphene layer is to be formed. It is not necessarily required to remove all of the oxide film covering the SiC single crystal substrate.

The SiC single crystal substrate in which the oxide film is thus removed to expose the Si surface is then heated under an oxygen atmosphere to form the $SiO_2$ layer on the surface thereof. As described above, the graphene/SiC composite material in which a large-area graphene layer that is flat in an atomic level is formed on the SiC single crystal substrate can be advantageously obtained by heating under vacuum the SiC single crystal substrate with the $SiO_2$ layer formed on the surface thereof, as will be described later.

When the $SiO_2$ layer formed on the surface of the SiC single crystal substrate is too thin or too thick, it may be difficult to enjoy the excellent effect of the present invention. Accordingly, the thickness of the $SiO_2$ layer is 200 nm or less, and preferably from 2 nm to 110 nm.

The $SiO_2$ layer is formed on the surface of the SiC single crystal substrate, for example, by placing the SiC single crystal substrate in a furnace such as an electric furnace, and heating (burning) the SiC single crystal substrate under predetermined heating conditions (heating temperature, heating time and the like) while supplying oxygen into the furnace. When the $SiO_2$ layer is formed as described above, the heating conditions such as the heating temperature and heating time are appropriately decided depending on the desired thickness of the $SiO_2$ layer, and the number of layers, size or the like of graphene layer in the intended graphene/SiC composite material. Generally, a heating temperature of 1,000 to 1,200° C. and a heating time of about 5 minutes to 10 hours are employed. Further, as the oxygen atmosphere in heating, an atmosphere having an oxygen concentration of 99.9% or more is usually employed.

Then, the SiC single crystal substrate on which the $SiO_2$ layer has been formed as described above is heated under vacuum, thereby producing the desired graphene/SiC composite material.

At present, the inventors of the present invention understand the reason why the graphene/SiC composite material in which at least one large-area graphene layer that is flat in an atomic level is formed on the surface of the SiC single crystal substrate is obtained according to the production process of the present invention as follows. That is to say, the $SiO_2$ layer artificially formed on the surface of the SiC single crystal substrate shows a dense and homogeneous amorphous structure, unlike the above-mentioned oxide film formed by natural oxidation. Accordingly, when the SiC single crystal substrate having such a $SiO_2$ layer on the surface thereof is heated under vacuum, decomposition (sublimation) of the $SiO_2$ layer uniformly proceeds. At this time, existence of the $SiO_2$ layer on the substrate surface inhibits initiation of decomposition of SiC until raised to a higher temperature, so that defects or irregularities existing in a $SiO_2$/SiC interface are eliminated, thereby obtaining the smooth Si surface. Then, when heating is further continued, after the $SiO_2$ layer has disappeared, sublimation of Si atoms and self-organization of remaining C atoms proceed effectively from the Si surface to the inside of the SiC single crystal substrate and uniformly over the whole surface of the Si surface. Thus, the graphene/SiC composite material is advantageously obtained in which at least one large-area graphene layer that is flat in an atomic level is formed on the surface of the SiC single crystal substrate.

Here, the SiC single crystal substrate with the $SiO_2$ layer formed thereon is heated under vacuum. In the process for producing a graphene/SiC composite material according to the present invention, the SiC single crystal substrate with the $SiO_2$ layer formed thereon is usually heated under vacuum of about $1 \times 10^{-4}$ to $1 \times 10^{-10}$ torr. As previously described, in the conventional production process of graphene by pyrolysis of SiC, the SiC substrate has been heated under vacuum of a so-called high vacuum or more (degree of vacuum: $1 \times 10^{-9}$ torr or less). According to the production process of the present invention, it is possible to advantageously produce the desired graphene/SiC composite material under vacuum lower than conventional vacuum, for example, even under vacuum of about $1 \times 10^{-4}$ torr.

Further, the heating temperature and heating time for heating the SiC single crystal substrate with the $SiO_2$ layer formed thereon under such vacuum are appropriately set depending on the thickness of the $SiO_2$ layer, the desired number of layers of graphene in the graphene/SiC composite material, characteristics of such a composite material, and the like. Generally, the heating temperature of about 1,300 to 1,500° C. and the heating time of from several minutes to about 2 hours are employed.

The above-described formation of the $SiO_2$ layer on the surface of the SiC single crystal substrate and the heating of the SiC single crystal substrate with the $SiO_2$ layer formed thereon can be performed by a technique of forming the $SiO_2$ layer on the substrate in one furnace maintained at an oxygen atmosphere, and then, transferring the substrate to another furnace to heat it under vacuum in the another furnace. Further, it may be performed by a technique of forming the $SiO_2$ layer on the substrate under an oxygen atmosphere in one furnace, and then, exhausting oxygen in the furnace with a vacuum pump or the like to a predetermined degree of vacuum, followed by heating again.

According to the above-described process of the present invention, the graphene/SiC composite material having the following characteristics can be produced. In the production of the graphene/SiC composite material having the following characteristics, from the various conditions for forming the $SiO_2$ layer and the conditions for heating the SiC single crystal substrate with the $SiO_2$ layer formed thereon, which are described above, conditions are appropriately selected and employed depending on the desired characteristics.

By the production process of the present invention, the graphene/SiC composite material can be produced in which at least one graphene layer is formed on the SiC single crystal substrate, wherein the graphene layer has a region that is flat in an atomic level and that has a diameter of at least 1 µm or more. In this description and claims, the term "flat in an atomic level" means that the region has no steps having a height exceeding 0.25 nm.

Further, by the production process of the present invention, the graphene/SiC composite material in which at least one graphene layer is formed on the SiC single crystal substrate can be produced, wherein the graphene layer has a region of 20 µm square or more which is free from steps of 1.5 nm or more.

Furthermore, by the production process of the present invention, the graphene/SiC composite material in which at least one graphene layer is formed on the SiC single crystal substrate can be produced, wherein an outermost surface of the above-mentioned SiC single crystal substrate is a Si surface, a distance between the Si surface and the graphene layer nearest thereto is 0.29±0.03 nm, and a part of Si atoms constituting the Si surface and a part of C atoms constituting the above-mentioned nearest graphene layer form covalent bonds. According to researches of the present inventors, the graphene/SiC composite material having such characteristics has a bandgap, so that it is expected to largely contribute to creation of novel transistors or electronic devices.

Here, of the distance between the Si surface as the outermost surface of the SiC single crystal substrate and the graphene layer nearest to this Si surface: 0.29±0.03 nm, 0.29 nm is a value found by the present inventors, and ±0.03 nm is based on the report of other researchers (see J. Borysiuk et al., "Transmission electron microscopy and scanning tunneling microscopy investigations of graphene on 4H—SiC (0001)", 105, 023503 (2009)).

Further, according to the production process of the present invention, it is possible to produce the graphene/SiC composite material in which at least one graphene layer is formed on the SiC single crystal substrate, wherein the composite material has three or more graphene layers showing an ABC stacking structure. As for the graphene layer showing the ABC stacking structure, it is possible to control the bandcap by applying an electric field (see M. Aoki and H. Amawashi, "Dependence of band structures on stacking and field in layered graphene", 142, 123 (2007)). The characteristics of the graphene/SiC composite material in which a graphene layer showing the ABC stacking structure, such as β graphite, is formed on the SiC single crystal substrate have not been sufficiently revealed yet. However, due to such a unique stacking structure of the graphene layer, the graphene/SiC composite material is expected to have unique characteristics.

EXAMPLES

To further clarify the present invention, some examples of the present invention will be described. It is to be understood that the present invention is not limited to the details of the description of such examples, but may be embodied with various changes, modifications and improvements that may occur to those skilled in the art, without departing from the scope of the invention.

In the following examples and comparative examples, a 6H—SiC single crystal substrate (surface: Si surface, on-axis) manufactured by Cree, Inc. USA was used as a SiC single crystal substrate, unless otherwise specified. Before a $SiO_2$ layer was formed, the SiC single crystal substrate was immersed in hydrofluoric acid for a predetermined period of time to remove an oxide film formed on a surface thereof. Further, finally obtained samples were observed using a JEM-2010 type transmission electron microscope (accelerating voltage: 200 kV, hereinafter referred to as a TEM) manufactured by JEOL Ltd., unless otherwise specified, and samples for TEM observation was prepared according to an ion thinning process.

Example 1

First, a SiC single crystal substrate from which an oxide film was removed to expose a Si surface was placed in a furnace, and the substrate was heated under an oxygen atmosphere (oxygen concentration: 99.9% or more, hereinafter the same) at 1,200° C. for 1 hour, thereby forming a $SiO_2$ layer (amorphous layer) having a thickness of 25 nm on a surface of the SiC single crystal substrate. The SiC single crystal substrate with the $SiO_2$ layer formed thereon was placed in a furnace to which a vacuum pump was connected. After the furnace was hermetically sealed, the vacuum pump was actuated to initiate exhaust of the inside of the furnace, and heating of the furnace was initiated. Then, the SiC single crystal substrate was heated under vacuum (degree of vacuum: $1\times10^{-4}$ torr) at 1,350° C. for 0.5 hour. The SiC single crystal substrate subjected to the above-mentioned treatment was used as a sample and a cross section thereof was observed by using the TEM. A TEM photograph thereof is shown in FIG. 1.

Comparative Example 1

A SiC single crystal substrate from which an oxide film was removed to expose a Si surface was placed in a furnace to which a vacuum pump was connected, without forming a $SiO_2$ layer on a surface thereof. Then, the SiC single crystal substrate was heated under the same conditions as in Example 1 described above. The SiC single crystal substrate subjected to the above-described treatment was used as a sample and a cross section thereof was observed by using the TEM. A TEM photograph thereof is shown in FIG. 2.

Figure 2:
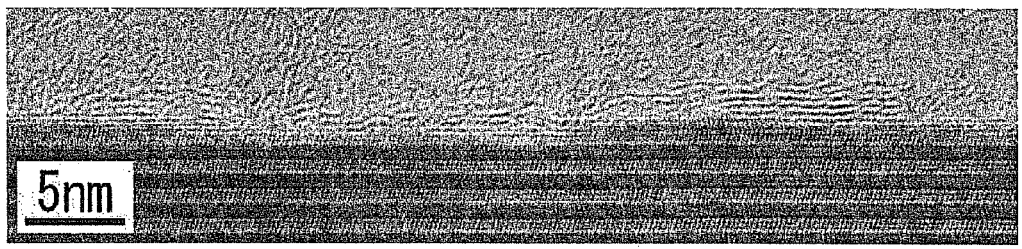
FIG. 2 is a TEM photograph of a graphene/SiC composite material produced according to a conventional process.

As apparent from the respective TEM photographs shown in FIG. 1 and FIG. 2, in the SiC single crystal substrate treated according to the present invention, it was observed that a large-area graphene layer was formed on the surface of the substrate, thereby obtaining a graphene/SiC composite material (Example 1). Compared to this, when no $SiO_2$ layer was formed on the surface of the SiC single crystal substrate, it was confirmed that only a small-area graphene layer was formed in places on the surface of the substrate, which made it difficult to use the substrate as the graphene/SiC composite material (Comparative Example 1).

Examples 2 to 4

First, under the same conditions as in Example 1, three SiC single crystal substrates were prepared on each surface of which a $SiO_2$ layer having a thickness of 25 nm was formed. Those SiC single crystal substrates were heated under vacuum (degree of vacuum: $1\times10^{-4}$ torr) under the conditions (heating temperature and heating time) shown in the following Table 1. Cross sections of the respective SiC single crystal substrates after the heat treatment were observed by using the TEM. As a result, it was confirmed that all were graphene/SiC composite materials in which at least one graphene layer was formed on the SiC single crystal substrate. The numbers of layers of graphene observed in the respective graphene/SiC composite materials are shown in the following Table 1, together with the conditions (heating temperature and heating time) and the number of layers of graphene in the above-described Example 1. In particular, it was observed that the graphene layer in Example 3 (heating conditions: 1,400° C.×1 hour) had a three-layer structure and was a large-area graphene having a maximum length amounting to 900 nm.

TABLE 1

|  | Heating Temperature (° C.) | Heating Time (hour) | Number of Layers of Graphene |
| --- | --- | --- | --- |
| Example 1 | 1350 | 0.5 | 1 |
| Example 2 | 1450 | 0.5 | 2 |
| Example 3 | 1400 | 1.0 | 3 |
| Example 4 | 1500 | 0.5 | 9 |

Figure 3:
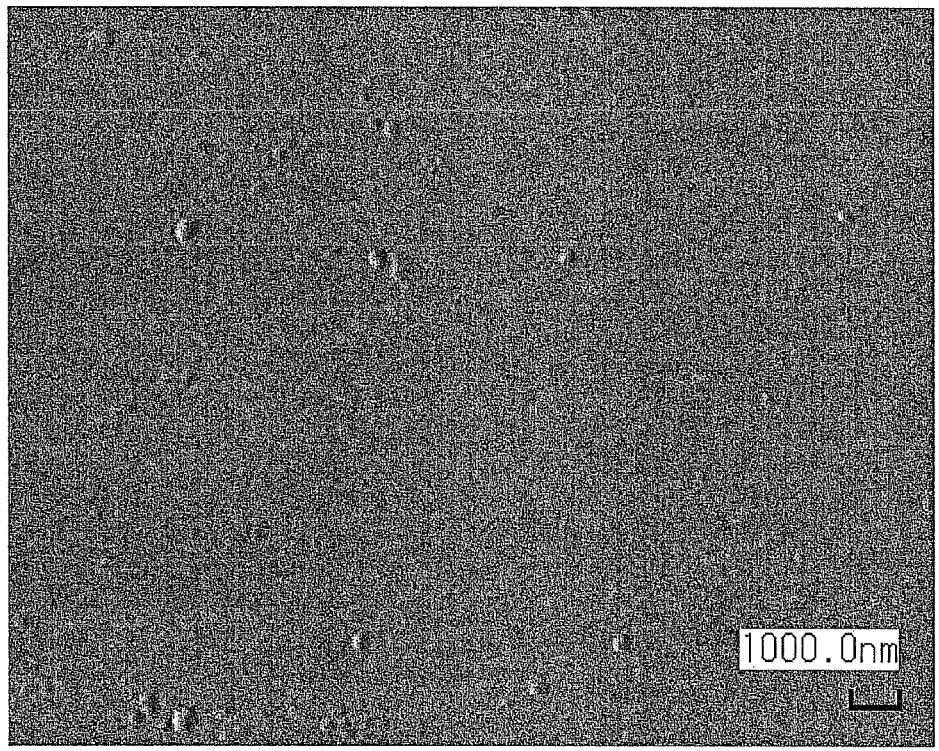
FIG. 3 is an AFM photograph of a graphene/SiC composite material produced according to the present invention.

Further, as for the graphene/SiC composite material obtained in Example 2, a surface on the side on which the graphene layer was formed was observed by using an atomic force microscope (AFM, manufactured by KEYENCE, trade name: VN-8000). An AFM photograph thereof is shown in FIG. 3. By the observation of such an AFM photograph and the TEM, it was confirmed that, in the graphene/SiC composite material obtained in Example 2, the graphene layer thereof had 1) a region that was flat in an atomic level and had a diameter of at least 1 µm or more, and 2) a region of 20 µm square or more which is free from steps of 1.5 nm or more was present.

Furthermore, a cross section of the graphene/SiC composite material obtained in Example 3 was observed by using the TEM, and a density of states profile of the composite material was prepared using such observation results by means of a density-functional formalism. Then, the bandgap of the graphene/SiC composite material obtained in Example 3 was calculated from the density of states profile. The result thereof was 0.05 eV. In addition, as for the graphene/SiC composite material obtained in Example 3, by TEM observation, it was observed: an outermost surface of the SiC single crystal substrate was a Si surface; the distance between the Si surface and the graphene layer nearest thereto was 0.29 nm; and a part of Si atoms constituting the Si surface and a part of C atoms constituting the nearest graphene layer formed covalent bonds.

Example 5

A SiC single crystal substrate from which an oxide film was removed to expose a Si surface was placed in a furnace, and the substrate was heated under an oxygen atmosphere at 1,200° C. for 10 minutes, thereby forming a $SiO_2$ layer (amorphous layer) having a thickness of about 10 nm on a surface of the SiC single crystal substrate. The SiC single crystal substrate with the $SiO_2$ layer formed thereon was placed in a furnace to which a vacuum pump was connected. After the furnace was hermetically sealed, the vacuum pump was actuated to initiate exhaust of the inside of the furnace, and heating of the furnace was initiated at the same time. Then, the SiC single crystal substrate was heated under vacuum (degree of vacuum: $1\times10^{-4}$ torr) at 1,450° C. for 0.5 hour. A cross section of the obtained sample (SiC single crystal substrate) was observed by using the TEM. As a result, it was confirmed that the graphene layer showing a three-layer structure was produced.

Example 6

A SiC single crystal substrate from which an oxide film was removed to expose a Si surface was placed in a furnace, and the substrate was heated under an oxygen atmosphere at 1,200° C. for 3 hours, thereby forming a $SiO_2$ layer (amorphous layer) having a thickness of about 110 nm on a surface of the SiC single crystal substrate. The SiC single crystal substrate with the $SiO_2$ layer formed thereon was placed in a furnace to which a vacuum pump was connected. After the furnace was hermetically sealed, the vacuum pump was actuated to initiate exhaust of the inside of the furnace, and heating of the furnace was initiated at the same time. Then, the SiC single crystal substrate was heated under vacuum (degree of vacuum: $1\times10^{-4}$ torr) at 1,450° C. for 0.5 hour. A cross section of the obtained sample (SiC single crystal substrate) was observed by using the TEM. As a result, it was confirmed that the graphene layer showing a three-layer structure was produced.

Example 7

A 4H—SiC single crystal substrate (surface: Si surface, on-axis) manufactured by Cree, Inc. USA was first immersed in hydrofluoric acid for a predetermined period of time to remove an oxide film formed on a surface thereof. Then, the SiC single crystal substrate from which the oxide film was removed to expose a Si surface was placed in a furnace, and the substrate was heated under an oxygen atmosphere at 1,200° C. for 1 hour, thereby forming a $SiO_2$ layer (amorphous layer) having a thickness of 25 nm on a surface of the SiC single crystal substrate. The SiC single crystal substrate on which the $SiO_2$ layer was formed was placed in a furnace to which a vacuum pump was connected. After the furnace was hermetically sealed, the vacuum pump was actuated to initiate exhaust of the inside of the furnace, and heating of the furnace was initiated at the same time. Then, the SiC single crystal substrate was heated under vacuum (the degree of vacuum: $1\times10^{-4}$ torr) at 1,450° C. for 0.5 hour. A cross section of the SiC single crystal substrate subjected to the above-mentioned treatment was observed by using the TEM. As a result, it was observed that the large-area graphene layer was formed on the surface of the substrate, thereby obtaining a graphene/SiC composite material. Further, in such a graphene/SiC composite material obtained in Example 7, it was confirmed that the graphene layer had a five-layer structure.

Example 8

A 6H—SiC single crystal substrate was used in the same manner as in Examples 1 to 6. First, the SiC single crystal substrate from which an oxide film was removed to expose a Si surface was placed in a furnace, and the substrate was heated under an oxygen atmosphere at 1,200° C. for 1 hour, thereby forming a $SiO_2$ layer (amorphous layer) having a thickness of 25 nm on a surface of the SiC single crystal substrate. The SiC single crystal substrate with the $SiO_2$ layer formed thereon was placed in a furnace to which a vacuum pump was connected. After the furnace was hermetically sealed, the vacuum pump was actuated to initiate exhaust of the inside of the furnace, and heating of the furnace was initiated at the same time. Then, the SiC single crystal substrate was heated under vacuum (degree of vacuum: $1\times10^{-4}$ torr) at 1,450° C. for 1 hour. The SiC single crystal substrate subjected to the above-described treatment was used as a sample and a cross section thereof was observed by using a JEM-2010F type transmission electron microscope (accelerating voltage: 200 kV) manufactured by JEOL Ltd. As a result, it was observed that the sample was a graphene/SiC composite material in which five large-area graphene layers were formed on the substrate surface, and that the graphene layer showing a five-layer structure on the substrate surface showed an ABC stacking structure. The sample for observation was prepared by the ion thinning process.

Comparative Example 2

Figure 4:
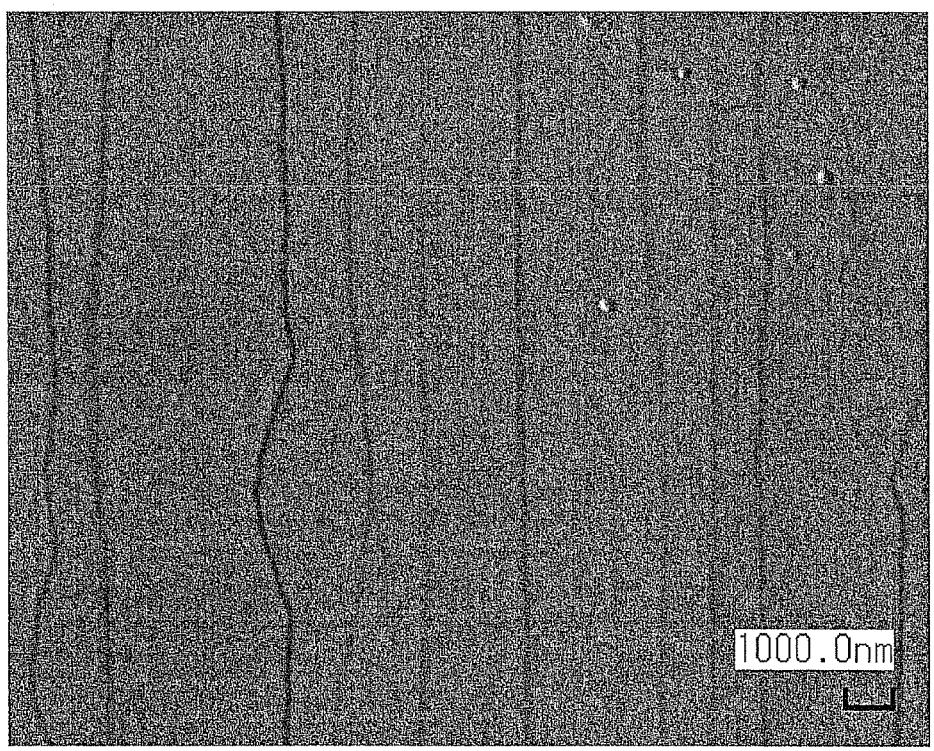
FIG. 4 is an AFM photograph of a graphene/SiC composite material produced by a technique other than the present invention.

A 6H—SiC single crystal substrate was used in the same manner as in Examples 1 to 6. The SiC single crystal substrate was placed in a furnace, and the SiC single crystal substrate was heated under an argon gas atmosphere (1 atm) at 1,500° C. for 0.5 hour while keeping the argon gas atmosphere. The SiC single crystal substrate after the heat treatment was used as a sample to observe a surface on which the graphene layer was formed by using the AFM. An AFM photograph thereof is shown in FIG. 4. As apparent from FIG. 4, in the graphene/SiC composite material produced by the technique different from the present invention, it was observed that steps of 1.5 nm or more were present in a region of 20 μm square of the graphene layer, so that it was difficult to say that the graphene layer was flat.

What is claimed is:

1. A graphene/SiC composite material having at least one graphene layer formed on an SiC single crystal substrate, said graphene/SiC composite material being produced according to a process comprising the steps of:
    removing an oxide film that is formed by natural oxidation and which covers a surface of the SiC single crystal substrate, thereby exposing an Si surface of the SiC single crystal substrate,
    heating the SiC single crystal substrate with the Si surface exposed under an oxygen atmosphere, thereby forming an $SiO_2$ layer on the surface of the SiC single crystal substrate, and
    heating the SiC single crystal substrate under vacuum on which the $SiO_2$ layer was formed;
    wherein the at least one graphene layer is formed on the SiC single crystal substrate, wherein the at least one graphene layer has a region that is flat at an atomic level and that has a diameter of at least 1 μm or more, wherein the at least one graphene layer has a region of 20 μm square or more which is free from steps of 1.5 nm or more, and wherein the at least one graphene layer comprises three or more graphene layers, and the three or more graphene layers define an ABC stacking structure.

2. The graphene/SiC composite material according to claim 1, wherein an outermost surface of the SiC single crystal substrate is an Si surface, a distance between the Si surface and the graphene layer nearest thereto is 0.29±0.03 nm, and a part of Si atoms constituting the Si surface and a part of C atoms constituting the nearest graphene layer form covalent bonds.

3. The graphene/SiC composite material according to claim 1, wherein a crystal structure of the SiC single crystal substrate is one of 4H-SiC and 6H-SiC.

* * * * *